United States Patent
Gandhi

(12) 
(10) Patent No.: US 6,429,637 B1
(45) Date of Patent: Aug. 6, 2002

(54) ELECTRONIC POWER METER WITH PHASE AND NON-LINEARITY COMPENSATION

(75) Inventor: Guljeet S. Gandhi, Noida (IN)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/632,762

(22) Filed: Aug. 4, 2000

(51) Int. Cl.⁷ .............................................. G01R 21/00
(52) U.S. Cl. ........................................ 324/74; 324/142
(58) Field of Search ................................ 324/142, 107, 324/110, 126, 74

(56) References Cited

U.S. PATENT DOCUMENTS

| | | | | |
|---|---|---|---|---|
| 4,331,915 A | * | 5/1982 | Fielden ......................... | 324/110 |
| 4,556,843 A | * | 12/1985 | Milkovic et al. ............ | 324/107 |
| 5,017,860 A | * | 5/1991 | Germer et al. ............... | 324/142 |
| 5,151,866 A | | 9/1992 | Glaser et al. | |
| 5,231,347 A | * | 7/1993 | Voisine et al. ............... | 324/107 |
| 5,446,373 A | * | 8/1995 | Bierl ........................... | 324/142 |
| 5,498,956 A | * | 3/1996 | Kinney et al. ............... | 324/142 |
| 5,548,209 A | * | 8/1996 | Lusignan et al. ............ | 324/142 |

FOREIGN PATENT DOCUMENTS

| | | |
|---|---|---|
| EP | 0 288 413 | 10/1988 |
| EP | 0 413 6770 | 11/1992 |

* cited by examiner

Primary Examiner—N. Le
Assistant Examiner—Vincent Q. Nguyen
(74) Attorney, Agent, or Firm—Samuels, Gauthier & Stevens, LLP

(57) ABSTRACT

An electronic power meter for metering the consumption of electrical energy on power lines includes phase compensation on current transformers, whereby the acquisition of one of the two samples for the current signals is delayed and time shifted averaged, such that the average of the two signals provides a compensated signal. The amount of delay is determined from the phase lag the current transformers exhibit during the process of calibration for phase compensation. The amount of compensation that is applied varies with current, thus compensation for the non-linearity in the phase shift for the current transformers. The degree of non-linearity is computed which results in only two variables that define the phase lag at higher current and the degree of non-linearity. The technique helps in using inexpensive current transformers in the meter.

8 Claims, 3 Drawing Sheets

ELECTRONIC POWER METER WITH PHASE AND NON-LINEARITY COMPENSATION

BACKGROUND OF THE INVENTION

The invention relates to an electronic power meter using a processor for all its computations and includes compensation of phase lag on the current transformers used for sensing the line currents.

Conventional power meters utilize current transformers for sensing line currents. As inductive elements, all current transformers exhibit definite phase lag between the primary and the secondary. The error due to this phase lag affects the accuracy of measurements and thereby resulting in overall inaccuracy. Power meter manufacturers are used to implementing conventional phase shifters using variable resistors and/or variable capacitors for each of the three phases increasing the material and production cost. Moreover, variable RC network phase shifting is not applicable to multiplexed signals in three phase electronic power meters. Phase compensation techniques have been previously described, for example, in U.S. Pat. Nos. 5,017,860 and 5,231,347.

Techniques have also been developed that use two analog-to-digital converters and by shifting the sampling time of one of the external circuitry increasing the cost of the hardware. These techniques do not compensate for the non-linearity in the phase shift with respect to the current that exists on the current transformers.

SUMMARY OF THE INVENTION

It is therefore an object of the invention to provide a simplified phase adjustment for an electronic power meter. It is another object of the invention to provide the exact amount of phased shift required for each of the current transformers on each of the phases, which could be different. It is yet another object of the invention to provide different amount of phase compensation at different currents to compensate for the non-linearity on the current transformer.

In practicing the invention, an electronic solid state power meter is provided for single phase power line and polyphase power lines utilizing a multi-channel analog to digital converter in built in the processor, to first provide a phase compensation on the current and voltage signals using time shifted averaging technique implemented in software and then subsequently using this compensated data for computing the powers and energies. The invention is very useful and is not computational intensive technique.

In accordance with the invention, a processor compensates the phase shift on current transformers by first estimating the delay between two samples of current signal for subsequent averaging in computations in software. Estimating the amount of desired variation of delay with respect to current will not only compensate for the phase shift on the current transformers, but also compensates for the non-linearity in the phase shift. The phase voltages are scaled down to lower voltages using potential dividers and currents are fed to the primary of the current transformers. The secondary of the current transformer provides a current output proportional to turn ratio between the secondary and the primary of the transformer. A resistor with very low temperature coefficient terminated on the secondary of the current transformer provides a potential proportional to the value of the resistance and the current in the secondary. These signal conditioned phase voltage and line current signals are fed to the analog to digital converter, which is part of the processor, to digitize at periodic intervals. The digitized signal are used by the processor to multiply and compute instantaneous powers and are then integrated for a finite number of mains cycles to compute energy. The computed energy value is stored in the internal non-volatile memory at desired intervals of time.

DETAILED DESCRIPTION OF THE INVENTION

Figure 1:
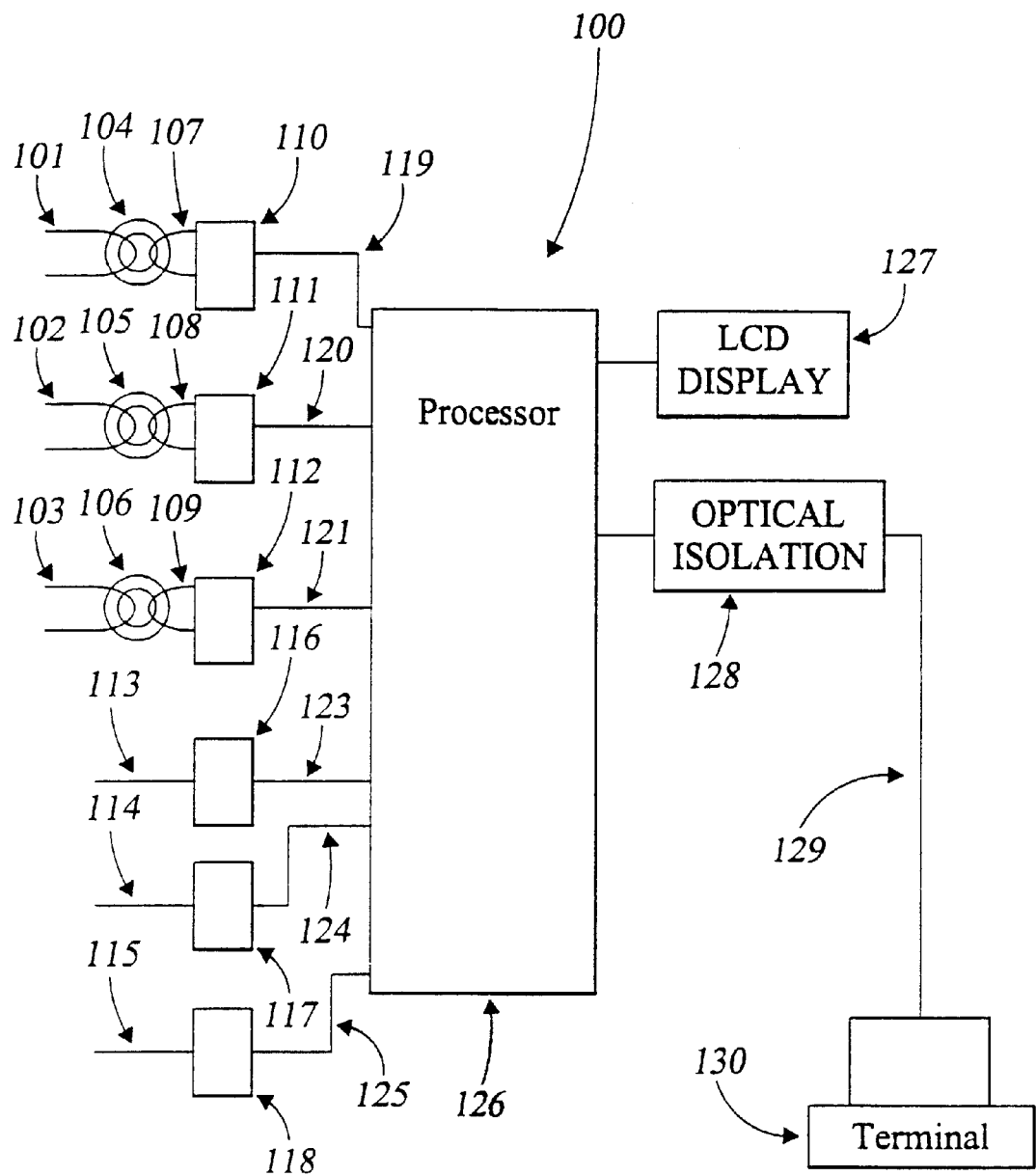
FIG. 1 is a schematic block diagram of a three-phase electronic power meter in accordance with the invention.
Figure 2:
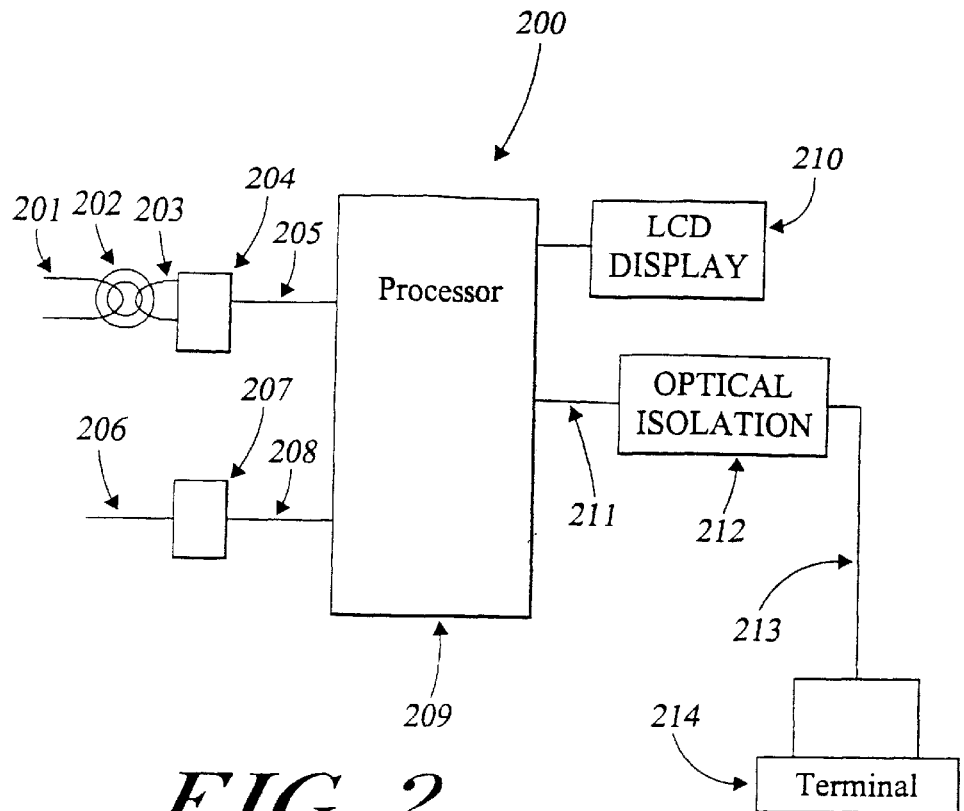
FIG. 2 is a schematic block diagram of a single-phase electronic power meter in accordance with the invention.

The invention has been implemented in an exemplary three-phase electronic power (watt-hour) meter 100 as shown in FIG. 1 and in an exemplary single phase electronic power (watt-hour) meter 200 as shown in FIG. 2.

FIG. 1 is a schematic block diagram of an exemplary three phase electronic power meter 100 in which three line currents 101, 102 and 103 are fed to respective current transformers 104, 105 and 106 on the primary. The secondary of these transformers are respectively connected to terminating resistors 110, 111 and 112 to provide potential signals proportional to current on lines 119, 120 and 121 to a processor 126. The processor includes a built-in multichannel-sampling analog to digital converter 132, Phase voltages on lines 113, 114 and 115 are fed to potential dividers 116, 117 and 118 to provide low level voltage signals on lines 123, 124 and 125 to the processor 126. The multichannel-sampling analog to digital converter digitizes and stores the signals in an internal memory for computations. For each current channel, the sampling is performed twice. The first current sample is taken before the voltage sample the sampling time is preponed by the desired amount. The second sample for the same current channel is acquired after sampling the respective voltage channel.

If the there is no phase lag between the primary and the secondary of the current transformer (an ideal situation), then the time between the current sample a and the voltage sample v, and the time between this voltage sample v and the current sample b is equidistant or the same. Then the average of the current sample a and current sample b will fall exactly on the voltage sample. If the current waveform is lagging behind the voltage waveform by, for example, 0.1 degrees (in case of a 50Hz sine wave (mains)), it will take 20 milli-seconds for one full wave, which could be equivalent to approximately 5.6 micro-seconds lag. Once the first sample is preponed by, for example, 11.2 micro-seconds, then the average of the two current samples will be a compensated current value for the CT.

Figure 5:
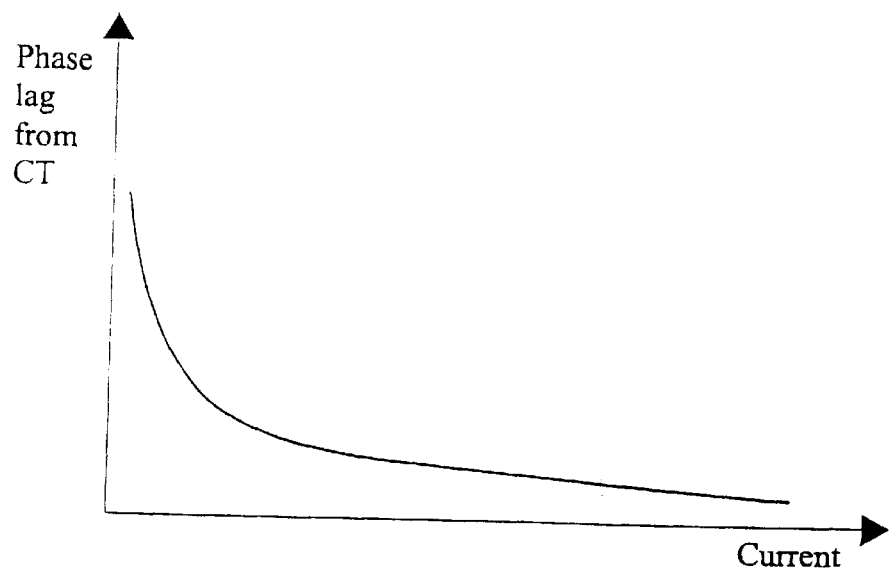
FIG. 5 is a plot of phase lag with respect to current.
Figure 3:
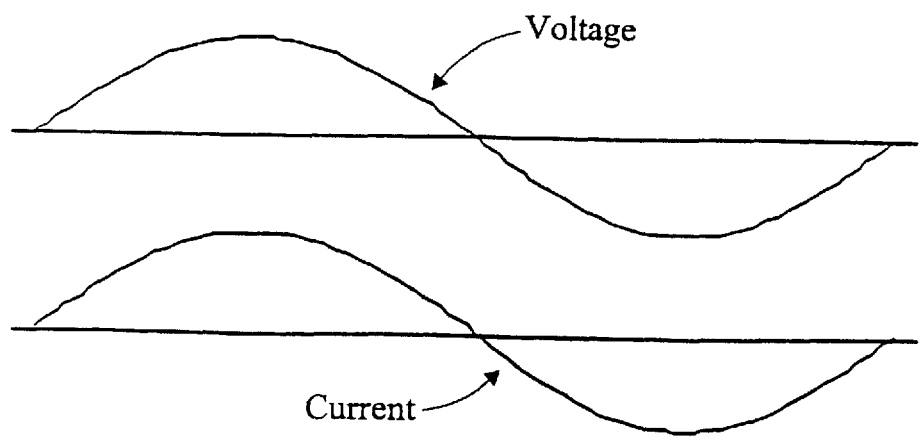
FIG. 3 is a plot of in-phase current and voltage signals.
Figure 4:
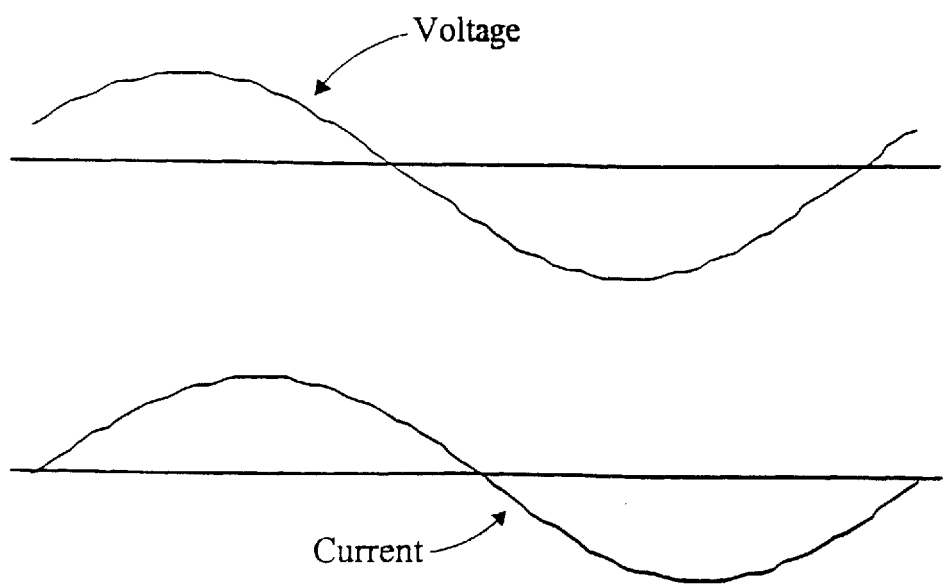
FIG. 4 is a plot of current and voltage signals illustrating a delayed current signal with respect to the voltage and delay caused by the signal lag on the secondary of the current transformer with respect to the primary.

In an ideal situation, when there is no phase shift on the secondary of the current transformer with respect to the primary, the current signals on lines 119, 120 or 121 will be in phase with the low level voltage signals on lines 123, 124 or 125, respectively, when the power factor is unity. FIG. 3 shows this ideal situation graphically. Due to the inherent characteristics of the current transformer, which is an inductive element, the current in the secondary lags behind the current in the primary as shown in the graph of FIG. 4. The amount of phase shift varies with current as shown in the graph of FIG. 5.

The scaling factor on the phase voltages by the potential dividers 116, 117 and 118 need not necessarily match for each of the channels. Similarly, the phase shift on the current transformers 104, 105 and 106 and the terminating resistors 110, 111 and 112 need not necessarily match for each phase. The technique enables the user to perform phase compensation on each of the phases separately.

The digitized signals from the analog to digital converter 132 are in the form of binary signals are stored in the internal data memory. This raw data is used for computing a weighted average for the current channel. This averaged current sample value is then used for various computations over an integral number of line cycles including root mean square value of each phase voltage, root mean square value of each line current, instantaneous value of active power. Multiplication of the root mean square value of current and voltage provides apparent power. The ratio of apparent power to active power provides the power factor. At source when the line currents 101, 102 and 103 in FIG. 1 are in phase with the phase voltages 113, 114 and 115 respectively, there is a finite phase shift on the secondary 107, 108 and 109 with respect to the phase voltages on lines 113, 114 and 115, respectively. The phase shift results in power factor value, which is not equal to unity or 1.

As an optimum method of calibration for the phase shift on the current transformers the current is applied at 101, 102 and 103 with a phase lag of 60° with respect to the phase voltages on lines 113, 114 and 115. In an ideal situation when there is no phase shift on the current transformers 104, 105 and 106, the power factor computed by the processor will be 0.5, which is equal to cosine of 60°.

Due to the inherent phase lag on the current transformers 104, 105 and 106, the power factor computed by the processor 126 will be more than 0.5 when a current is applied at 60° lag. This difference in power factor between the ideal and the normal situation is due to the phase shift on the current transformers. A method has been devised to key in the "add value" to indicate the phase shift at high currents and then the "guard value" for the limit in phase shift that needs to be compensated for lower currents. The rate at which the phase needs to be compensated over the entire range of current is pre-programmed for a specific type of current transformer. The "add value" and the "guard value" are fed to the processor using the software on the external terminal. The measurement of the power factor on the preferred meter is carried out at different predefined currents, to check if the desired compensation had been achieved. The phase compensated data is then used for computing the active energy.

LCD 12 is, for example, a 8×1 LCD display with numeric characters, and displays all the parameters computed by the meter in a cyclic order. The meter communicates to external devices, such as a personal computer or handheld terminal 130 using an asynchronous communication port. For safety and electrical isolation, the asynchronous communication channel can be optically isolated by optical isolation 128 via line 129.

FIG. 2 is a schematic block diagram of an exemplary single phase electronic power meter 200 in which one line current 201 is fed to a current transformer 202, on the primary, the secondary 203, is connected to a terminating resistor 204, to provide potential signal proportional to current on line 205 provided to a processor 209. The processor 209 includes a built-in analog to digital converter 216. A phase voltage on line 206 is fed to a potential divider 207, to provide a low level signal on line 208 to the processor 209. LCD 210 can be an 8×1 LCD display with numeric characters, and displays all the parameters computed by the meter in a cyclic order. The meter communicates to external devices, like a personal computer or handheld terminal 214 using an asynchronous communication port. For safety and electrical isolation, the asynchronous communication channel is optically isolated by optical isolation unit 212 via line 213.

The acquisition of current and voltage signals and further processing of current signal is exactly same as in the case of the three-phase electronic power meter shown in FIG. 1.

Although the present invention has been shown and described with respect to several preferred embodiments thereof, various changes, omissions and additions to the form and detail thereof, may be made therein, without departing from the spirit and scope of the invention.

What is claimed is:

1. An electronic power meter for metering the consumption of electrical energy in polyphase power lines, comprising:
   at least one current channel defined by a passive current transformer with a primary and secondary winding having line current signals associated therewith;
   at least one voltage channel associated with a respective current channel and having phase voltage signals associated therewith;
   a processor with a sequential sampling analog to digital converter for digitizing phase voltage and line current signals on associated current and voltage channels, wherein
   said processor initially samples said current channels for a particular sample and following a selected time delay samples the associated voltage channel, said processor samples said current channel a second time following the sampling of said voltage channel for said particular sample, and stores the resulting digitized signals for use in performing a weighted average, the amount of time delay and the weights for averaging is determined on the basis of amount of phase lag that is to be compensated.

2. The electronic power meter of claim 1, wherein said time delay on said at least one current channel is calculated without changing the sampling of said at least one voltage channel.

3. The electronic power meter of claim 1, wherein said phase lag is compensated at different frequencies of mains and power lines without any additional or external circuitry.

4. The electronic power meter of claim 1, wherein said amount of lag is measured at lowest and highest currents to compensate for non-linearities.

5. The electronic power meter of claim 1, wherein said amount of phase that is to be compensated does not affect the magnitude of said line current signals and voltage signals.

6. The electronic power meter of claim 1, wherein said processor stores all computed data into an internal-volatile memory displayed on a LCD or LED and communicated to an external terminal using a standard protocol.

7. The electronic power meter of claim 1, wherein said phase lag is used to calculate other predefined constants.

8. The electronic power meter of claim 7, wherein said other predefined constants are downloaded from an external terminal connector to said electronic power meter.

* * * * *